United States Patent
Tasaka et al.

(10) Patent No.: US 9,252,739 B2
(45) Date of Patent: Feb. 2, 2016

(54) MODULE SUBSTRATE AND MODULE

(71) Applicant: TAIYO YUDEN CO., LTD., Tokyo (JP)

(72) Inventors: Naoyuki Tasaka, Kanagawa (JP); Tooru Takezaki, Kanagawa (JP); Ken Sasaki, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 188 days.

(21) Appl. No.: 14/102,305

(22) Filed: Dec. 10, 2013

(65) Prior Publication Data

US 2014/0210569 A1    Jul. 31, 2014

(30) Foreign Application Priority Data

Jan. 25, 2013 (JP) .................. 2013-012164

(51) Int. Cl.
*H03H 7/46* (2006.01)
*H04B 1/50* (2006.01)
*H03H 9/70* (2006.01)
*H03H 9/05* (2006.01)
*H04B 1/00* (2006.01)
*H03H 1/00* (2006.01)

(52) U.S. Cl.
CPC ............. *H03H 7/463* (2013.01); *H03H 9/0566* (2013.01); *H03H 9/70* (2013.01); *H04B 1/0057* (2013.01); *H03H 2001/0085* (2013.01); *H03H 2250/00* (2013.01)

(58) Field of Classification Search
CPC .............. H03H 7/463; H03H 7/465; H03H 2009/0019; H03H 9/0547; H03H 9/0557; H03H 9/0561; H03H 9/0566; H03H 9/0571; H03H 9/0576; H03H 9/70; H03H 9/706; H03H 9/725; H03H 2001/0085; H03H 2250/00; H04B 1/0053; H04B 1/006; H04B 1/0057
USPC .................. 333/133, 132; 455/78, 82, 83
See application file for complete search history.

(56) References Cited

U.S. PATENT DOCUMENTS

| 6,873,529 | B2 * | 3/2005 | Ikuta et al. ................ 361/719 |
| 6,879,488 | B2 * | 4/2005 | Takeda et al. ............. 361/704 |
| 6,974,724 | B2 * | 12/2005 | Hyvonen et al. ........... 438/107 |
| 8,483,104 | B1 * | 7/2013 | Saji et al. .................. 370/276 |
| 8,536,957 | B1 * | 9/2013 | Nakamura et al. ........ 333/132 |
| 2003/0189910 | A1 * | 10/2003 | Yamada et al. ............ 370/335 |

(Continued)

FOREIGN PATENT DOCUMENTS

JP    2006-203652 A    8/2006
JP    2006-211057 A    8/2006

(Continued)

OTHER PUBLICATIONS

Taiwanese Office Action dated Apr. 8, 2015, in a counterpart Taiwanese patent application No. 102144477.

(Continued)

*Primary Examiner* — Barbara Summons
(74) *Attorney, Agent, or Firm* — Chen Yoshimura LLP

(57) ABSTRACT

A module substrate includes: a multilayered wiring substrate that includes wiring layers; and embedded duplexers that are embedded in the multilayered wiring substrate and electrically connected to the wiring layers, wherein the embedded duplexers include duplexers supporting at least two bands of Band1, Band2, Band5, and Band8.

8 Claims, 8 Drawing Sheets

(56) References Cited

U.S. PATENT DOCUMENTS

| | | | |
|---|---|---|---|
| 2005/0003855 A1* | 1/2005 | Wada et al. | 455/552.1 |
| 2005/0104685 A1* | 5/2005 | Kuroki et al. | 333/133 |
| 2006/0194690 A1 | 8/2006 | Osuzu | |
| 2011/0156835 A1* | 6/2011 | Nagai | 333/132 |
| 2012/0154072 A1 | 6/2012 | Bae et al. | |
| 2012/0243446 A1 | 9/2012 | Mueller et al. | |
| 2012/0300416 A1* | 11/2012 | Saji et al. | 361/748 |
| 2013/0272176 A1 | 10/2013 | Uejima | |
| 2013/0314174 A1* | 11/2013 | Kato | 333/133 |
| 2013/0329611 A1* | 12/2013 | Kitajima | 370/278 |

FOREIGN PATENT DOCUMENTS

| | | |
|---|---|---|
| TW | 200500319 A | 1/2005 |
| WO | 2012/093539 A1 | 7/2012 |
| WO | WO 2012/105373 A1 * | 8/2012 |
| WO | WO 2012/117992 A1 * | 9/2012 |

OTHER PUBLICATIONS

European Search Report dated May 16, 2014, in a counterpart European patent application No. 13197548.4.
Sahota, "RF Front End Requirements for 3G and Beyond", 2010 IEEE International Ultrasonics Symposium Proceedings, Oct. 11, 2010, XP031953155, pp. 86-90.
Dharmalingam et al., "Integration of WCDMA Band VIII Duplexer on an LTCC Platform", IEEE Topical Meeting on Silicon Monolithic Integrated Circuits in RF Systems, Jan. 19, 2009, XP031415540, pp. 1-4.
Windemuth et al., "New Flipchip Technology", 4th IEEE Electronic System-Integration Technology Conference, Sep. 17, 2012, XP032428036, pp. 1-6.
Chinese Office Action dated Jul. 28, 2015, in a counterpart Chinese patent application No. 201410008629.0.
Korean Office Action dated Aug. 13, 2015, in a counterpart Korean patent application No. 10-2014-0007728.

* cited by examiner

MODULE SUBSTRATE AND MODULE

CROSS-REFERENCE TO RELATED APPLICATION

This application is based upon and claims the benefit of priority of the prior Japanese Patent Application No. 2013-012164, filed on Jan. 25, 2013, the entire contents of which are incorporated herein by reference.

FIELD

A certain aspect of the present invention relates to a module substrate and a module.

BACKGROUND

Electronic components such as filters and duplexers have been used in mobile communication devices such as mobile phones to transmit and receive a signal of a predetermined frequency. Japanese Patent Application Publication No. 2006-203652 discloses a module including a SAW (Surface Acoustic Wave) filter embedded in a multilayered wiring substrate to downsize the mobile communication device. In addition, there has been known a module that includes two or more duplexers to transmit and receive signals with two or more bands.

The standard for the frequency used for mobile communication may differ from one country to another. Thus, when a module includes two or more duplexers and the duplexers are embedded in the multilayered wiring substrate to reduce the size, a process of embedding an electronic component has to be separately performed for each country because a duplexer to be mounted depends on a country. Thus, the production process becomes complicate, and the production cost thereby increases.

SUMMARY OF THE INVENTION

According to an aspect of the present invention, there is provided a module substrate including: a multilayered wiring substrate that includes wiring layers; and embedded duplexers that are embedded in the multilayered wiring substrate and electrically connected to the wiring layers, wherein the embedded duplexers include duplexers supporting at least two bands of Band1, Band2, Band5, and Band8.

According to another aspect of the present invention, there is provided a module including the above described module substrate.

DETAILED DESCRIPTION

First Embodiment

Figure 1:
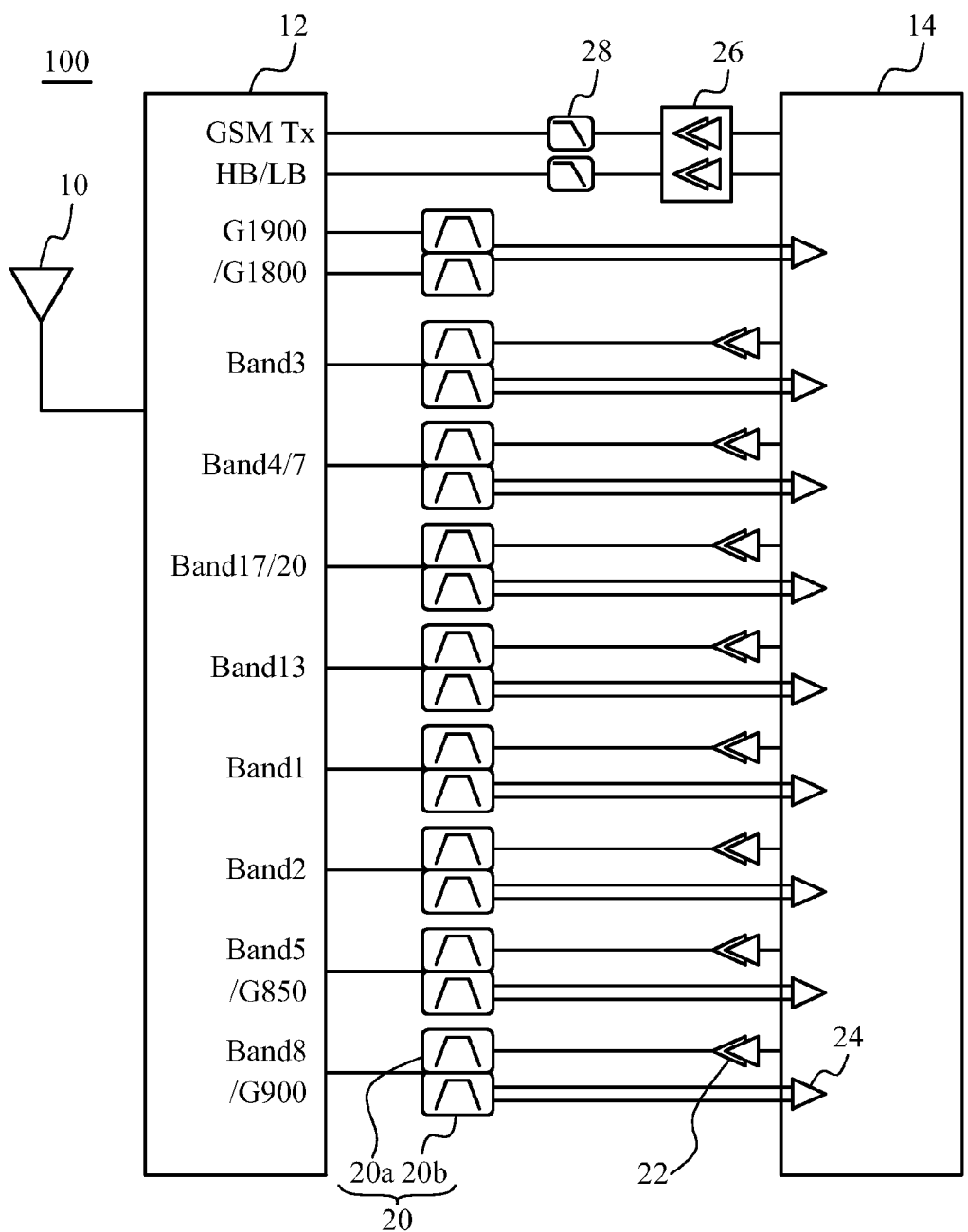
FIG. 1 is a circuit diagram of a module in accordance with a first embodiment.

FIG. 1 is a circuit diagram of a module 100 in accordance with a first embodiment. The module 100 includes an antenna 10, a switch circuit 12, and a high-frequency circuit 14. Duplexers 20 for respective bands are mounted between the switch circuit 12 and the high-frequency circuit 14. Each of the duplexers 20 includes a transmit filter 20a and a receive filter 20b. A power amplifier 22 to amplify a transmission signal is connected between the transmit filter 20a and the high-frequency circuit 14. The receive filter 20b is coupled to a low noise amplifier (LNA) 24 in the high-frequency circuit 14. Output terminals for GSM (registered trademark) Tx signals and HB/LB signals out of the bands are coupled to the high-frequency circuit 14 through a power amplifier unit 26 and transmit filters 28 without the duplexer 20. The switch circuit 12 switches a connection with a desired band. This enables to transmit and receive signals of multiple bands through the common antenna 10.

The module 100 of the first embodiment can support the following bands.

TABLE 1

| Name | Transmit band Tx [MHz] | Receive band Rx [MHz] | Classification |
| --- | --- | --- | --- |
| Band1 | 1920~1980 | 2110~2170 | General band |
| Band2 | 1850~1910 | 1930~1990 | General band |
| Band3 | 1710~1785 | 1805~1880 | Regional band |
| Band4 | 1710~1755 | 2110~2155 | Regional band |
| Band5 | 824~849 | 869~894 | General band |
| Band7 | 2500~2570 | 2620~2690 | Regional band |
| Band8 | 880~915 | 925~960 | General band |
| Band13 | 777~787 | 746~756 | Regional band |
| Band17 | 704~716 | 734~746 | Regional band |
| Band20 | 832~862 | 791~821 | Regional band |

Four bands including Band1 (Tx:1920~1980 MHz, Rx:2110~2170 MHz), Band2 (Tx:1850~1910 MHz, Rx:1930~1990 MHz), Band5 (Tx:824~849 MHz, Rx:869~894 MHz), and Band8 (Tx:880~915 MHz, Rx:925~960 MHz) are widely used in many regions in the world among the bands listed in the above table, and hereinafter, the aforementioned four bands are referred to as a "general band".

In contrast, Band4 (Tx:1710~1755 MHz, Rx:2110~2155 MHz) is a band currently used only in North America, and Band1 (Tx:2500~2570 MHz, Rx:2620~2690 MHz) is a band currently used only in Europe (EU). In addition, Band3 (Tx:1710~1785 MHz, Rx:1805~1880 MHz) is a standard for the Asia-Pacific region (APEC) and Europe (EU). As described above, the bands other than the four general bands in the bands listed in Table 1 are bands that are used in a certain region, and hereinafter, these bands are referred to as a "regional band".

Figure 2:
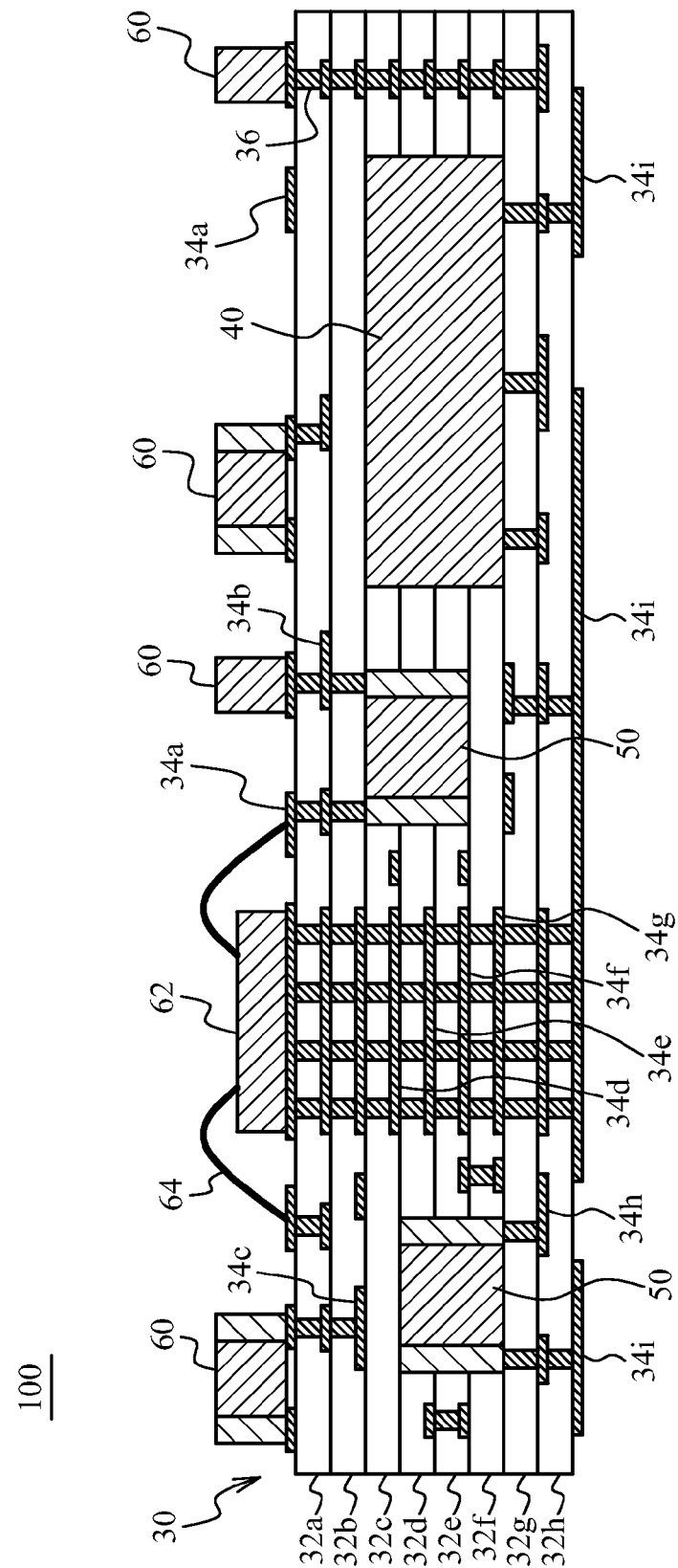
FIG. 2 is a schematic cross-sectional view of the module in accordance with the first embodiment.
Figure 3A:
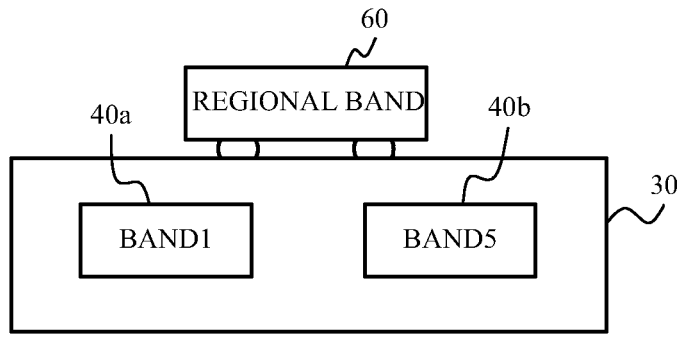
FIG. 3A through FIG. 3D are schematic views illustrating an arrangement relationship among duplexers in accordance with the first embodiment.
Figure 3B:
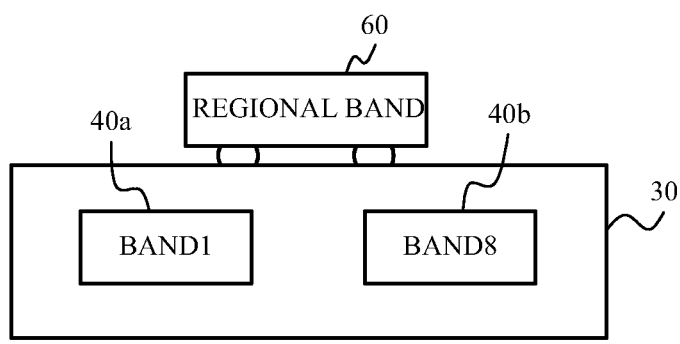
Figure 3C:
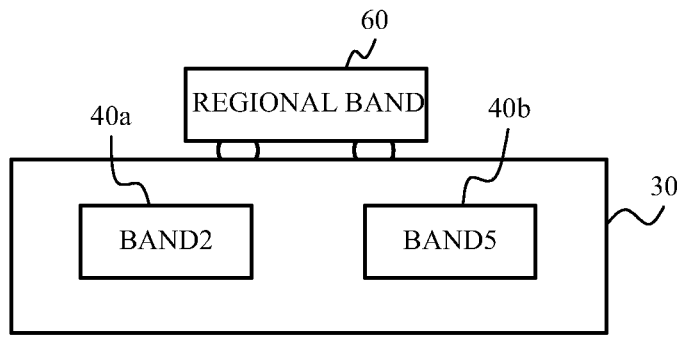
Figure 3D:
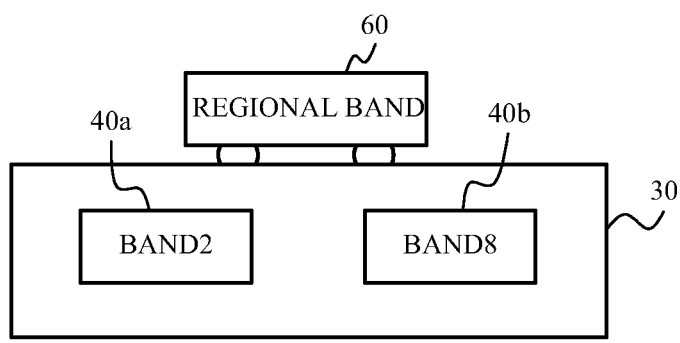

FIG. 2 is a schematic cross-sectional view of the module 100 in accordance with the first embodiment. The module 100 includes a multilayered wiring substrate 30 and an electronic component 40 embedded in the multilayered wiring substrate 30. The multilayered wiring substrate 30 includes insulating layers 32a~32h and wiring layers 34a~34i. The insulating layers 32c~32f, which are located in the middle, of the insulating layers 32a~32h are core layers in which the electronic component is embedded. In addition, the wiring layers 34a and 34i of the wiring layers 34a~34i are surface wiring layers formed on the surfaces of the multilayered wiring substrate 30, and the wiring layers 34b~34h are internal wiring layers formed between the insulating layers 32a~32h. Wiring layers 34 are interconnected by via wirings 36 penetrating through insulating layers 32.

The electronic component 40 includes a duplexer 20 illustrated in FIG. 1. In the first embodiment, the core layers 32c~32f form a multilayered wiring substrate, and an electronic component 50 is also embedded in other regions. The electronic component 50 may be a passive element (an inductor, a capacitor, or a resistance) including a built-in chip or an active element (a switch circuit or the like). The embedded electronic components 40 and 50 are electrically connected to the internal wiring layer 34h or the like (in the present embodiment, the electronic components 40 and 50 can be electrically connected from both the upper and lower surfaces).

Electronic components 60, 62 are mounted on the surface of the multilayered wiring substrate 30. The electronic component 60 is an electronic element fabricated as a chip as with the electronic component 50. In addition, a part of the electronic component 60 may include one or more duplexers as the electronic component 40 includes. The electronic component 62 is a power amplifier (corresponding to a reference numeral 22 in FIG. 1), mounted on the surface wiring layer 34a, and electrically connected to other surface wiring layers 34a by a bonding wire 64.

Here, as described previously, a usable band differs from one country to another. When only the duplexer included in the embedded electronic component 40 is used to address this situation, the type of the duplexer included in the electronic component 40 has to be changed for each country. In addition, the process of embedding the electronic component 40 has to be separately performed for each country. However, the process of embedding the electronic component is more complicate than the process of mounting the electronic component on the surface, and thus causes the increase of the production cost when separately performed for each country.

In the module 100 of the first embodiment, only the duplexers supporting the general bands are embedded, and a duplexer supporting the regional band is mounted on the surface of the multilayered wiring substrate 30. The more specific description will be given hereinafter.

FIG. 3A through FIG. 3D are schematic views illustrating an arrangement relationship among the duplexers of the first embodiment. On the surface of the multilayered wiring substrate 30, mounted is a duplexer included in the electronic component 60 that is surface-mounted (hereinafter, referred to as an "external duplexer"). Inside the multilayered wiring substrate 30, mounted is a duplexer included in the embedded electronic component 40 (hereinafter, referred to as an "embedded duplexer").

The external duplexer 60 is a duplexer supporting the regional band (at least one of Band3, Band4, Band1, Band13, Band17, and Band20). The external duplexer 60 may be a duplexer supporting two or more bands of the aforementioned regional bands. In this case, two or more duplexers having different passbands may be formed on a single chip, or on different chips. Thus, the number of the external duplexer 60 is one in FIG. 3, but may be two or more (this applies to FIG. 7A through FIG. 8D described later).

The first embodiment mounts two duplexers (40a, 40b) as the embedded duplexer. Two bands are selected from the general bands (Band1, Band2, Band5, and Band8) and assigned to embedded duplexers 40a and 40b. Here, as illustrated in FIG. 3A~FIG. 3D, the combination of two bands is preferably Band1 and Band5, Band1 and Band8, Band2 and Band5, or Band2 and Band8. This is because signal interference easily occurs by the duplexers of which the passbands are close to each other (see Table 1), and thus it is preferable to arrange the duplexers of which the passbands are distant from each other.

As described above, the module of the first embodiment has a structure in which only the duplexers supporting the general bands that are commonly used in many countries are embedded and a duplexer supporting the regional band that differs from one country to another is externally mounted. In more detail, the surface wiring layer 34a of the wiring layers 34 includes a terminal portion that allows the external duplexer 60 to be mounted thereon, and the external duplexer 60 is electrically connected to the terminal portion. Thus, in the fabrication stage, module substrates including the multilayered wiring substrate 30 and the embedded duplexer 40 are produced in large quantities, and the external duplexer 60 is mounted to suit the specification of each country in the process after that. This enables to maintain a structure in which the duplexers are embedded and standardize the fabrication process of the module substrate. Therefore, both the downsizing and the cost reduction can be achieved. In addition, modules that can be widely used in many countries in the world can be provided.

In the first embodiment, the multilayered wiring substrate 30 has a structure in which the wiring layers 34c~34f can be also formed in the core layers 32c~32f, but may employ other structures.

Figure 4:
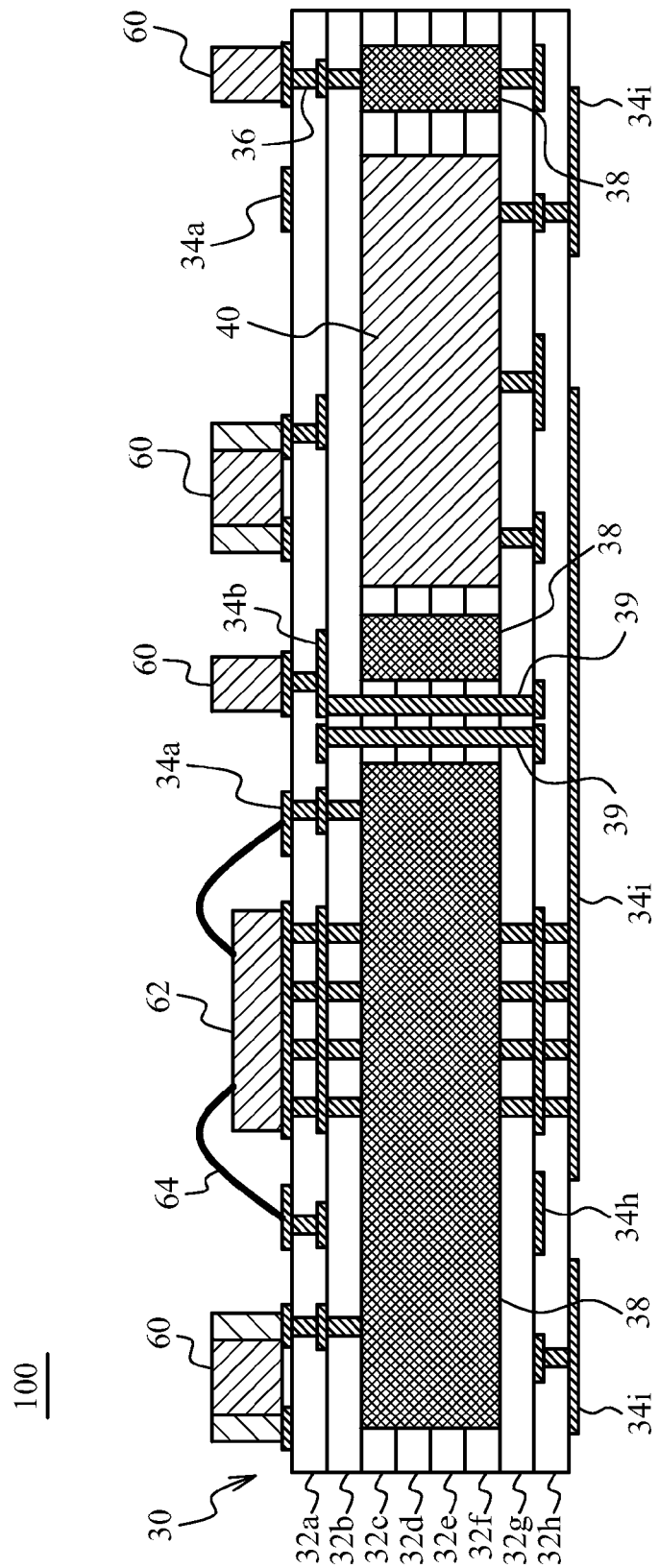
FIG. 4 is a schematic cross-sectional view of a module in accordance with a variation of the first embodiment.
Figure 5A:
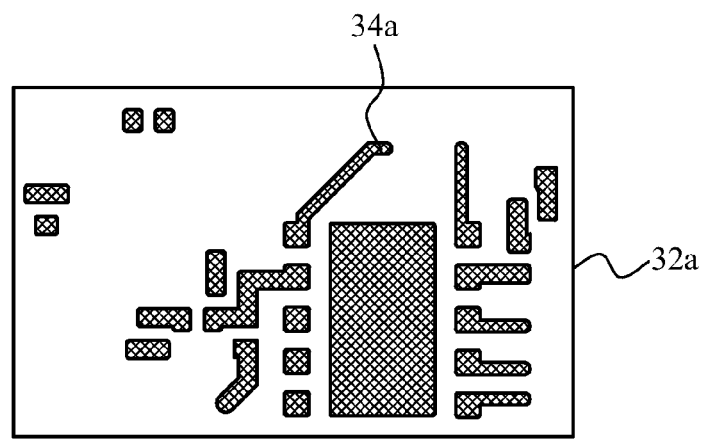
FIG. 5A through FIG. 5C are schematic plan views of layers of the module of the variation of the first embodiment (No. 1)
Figure 5B:
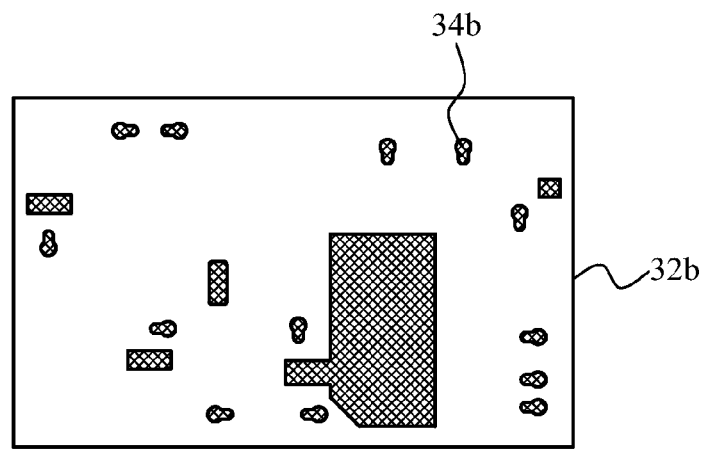
Figure 5C:
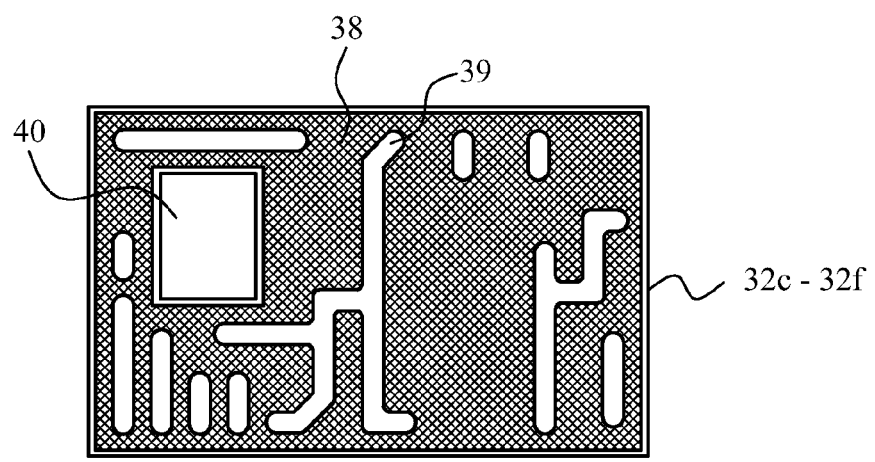
Figure 6A:
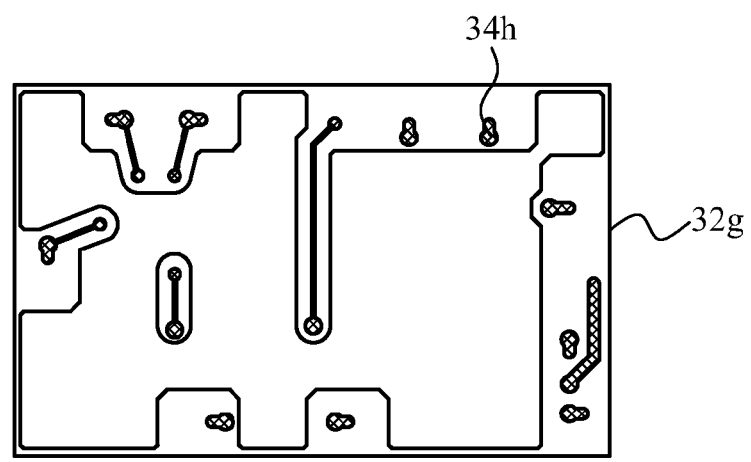
FIG. 6 and FIG. 6B are schematic plan views of layers of the module of the variation of the first embodiment (No. 2)
Figure 6B:
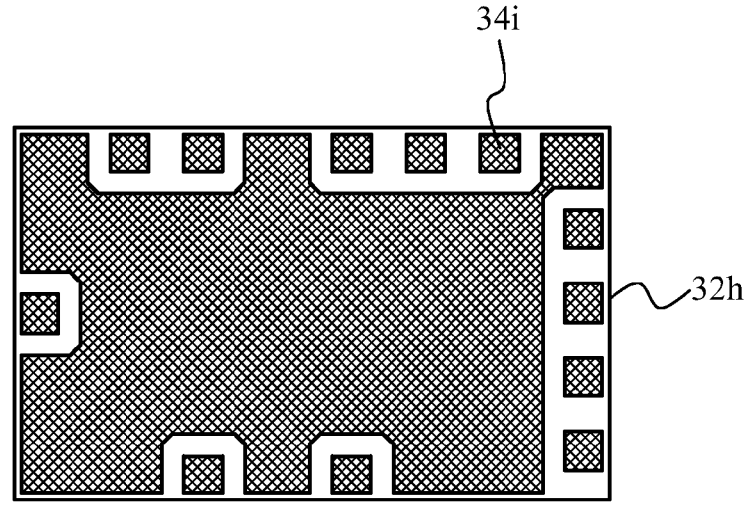

FIG. 4 is a schematic cross-sectional view of a module in accordance with a variation of the first embodiment. The same reference numerals are affixed to portions same as those of the first embodiment (FIG. 2), and a detailed description thereof is omitted. In the variation of the embodiment, a copper plate 38 is embedded in a part of the core layers 32c~32f of the multilayered wiring substrate 30. The copper plate 38 functions as a ground layer as well as a heat release pattern. The internal wiring layers 34d~34g as described in the first embodiment are not formed in the core layers 32c~32f, and through-holes 39 that penetrate through a part in which the copper plate 38 does not exist are formed instead.

FIG. 5A through FIG. 6B are plan views of layers in the multilayered wiring substrate 30. In each layer, a region in which the wiring layer 34 or the copper plate 38 exists is indicated by hatching. As illustrated in FIG. 5C, the embedded duplexer 40 is embedded in a rectangle hole formed in the copper plate 38 in the core layers 32c~32f. As described above, when the copper plate 38 is embedded in the core layers 32c~32f of the multilayered wiring substrate 30, a module having strong resistance to an external noise and good heat release performance can be obtained.

Second Embodiment

A second embodiment mounts three embedded duplexers.

FIG. 7A through FIG. 7D are schematic views illustrating an arrangement relationship among duplexers of the second embodiment, and correspond to FIG. 3A through FIG. 3D in the first embodiment. The external duplexer 60 supporting the regional band is mounted on the surface of the multilayered wiring substrate 30, and the embedded duplexers 40a~40c supporting the general bands are mounted inside the multilayered wiring substrate 30. In the present embodiment, three bands are selected from the general bands (Band1, Band2, Band5, and Band8), and assigned.

Figure 7A:
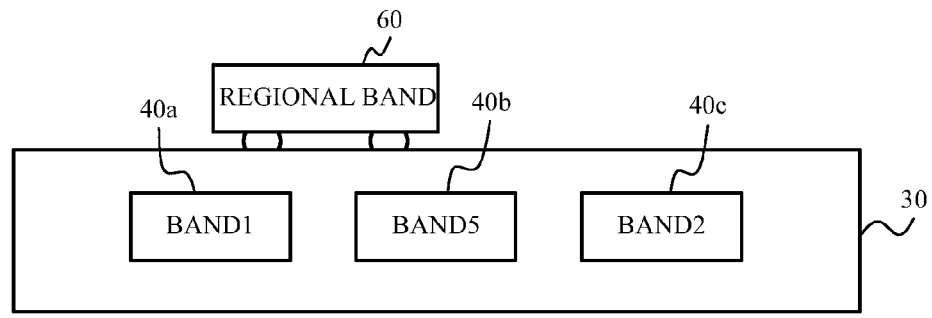
FIG. 7A through FIG. 7D are schematic views illustrating an arrangement relationship among duplexers in accordance with a second embodiment.
Figure 7B:
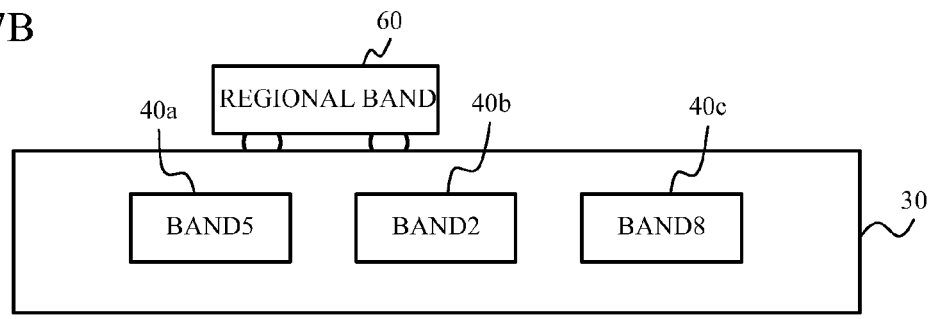
Figure 7C:
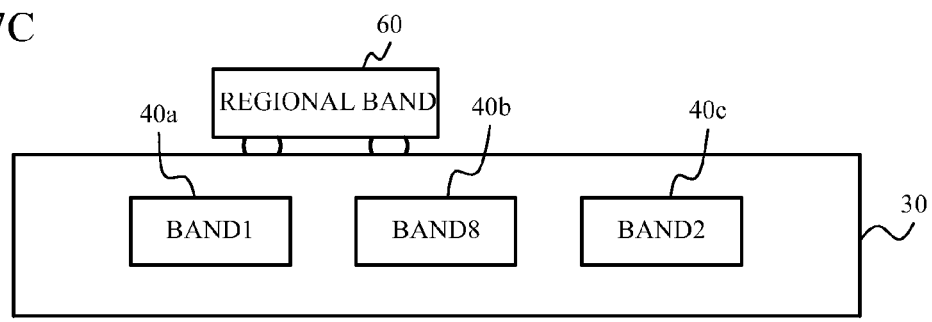
Figure 7D:
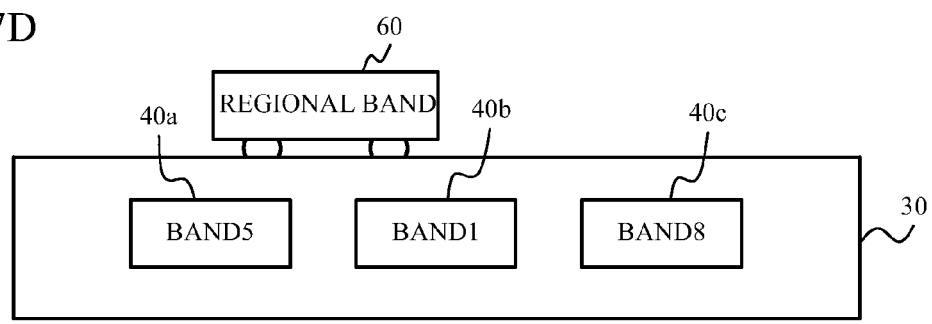
Figure 8A:
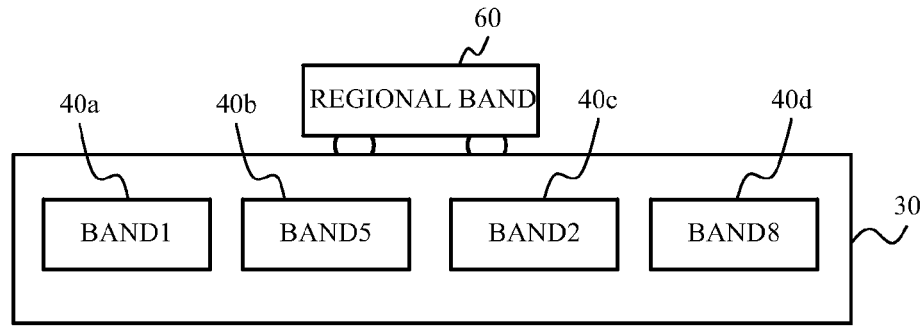
FIG. 8A through FIG. 8D are schematic views illustrating an arrangement relationship among duplexers in accordance with a third embodiment.
Figure 8B:
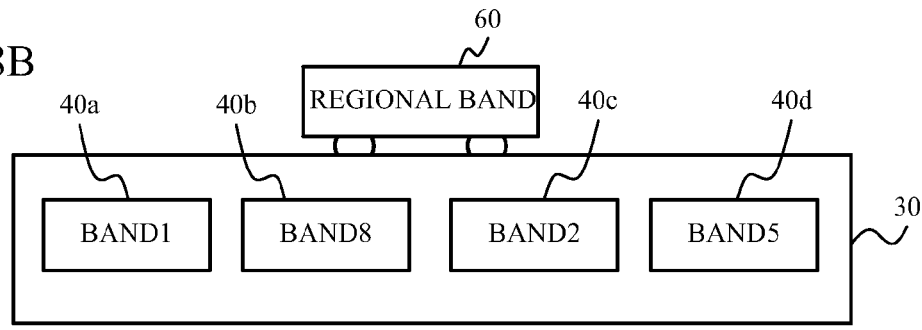
Figure 8C:
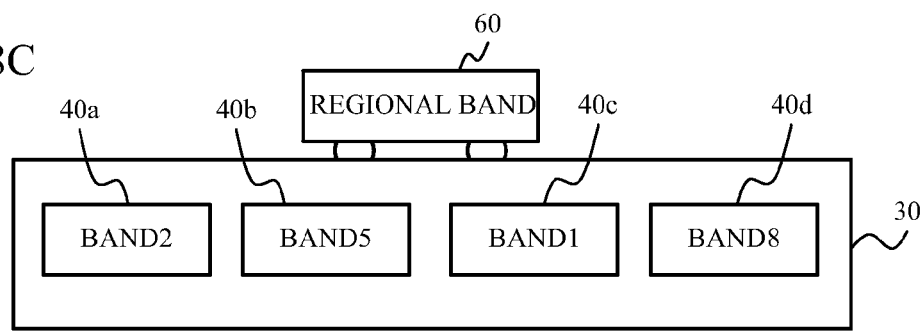
Figure 8D:
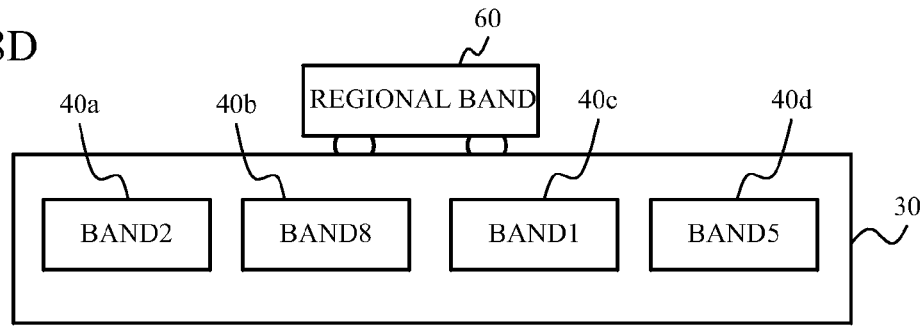

Here, as illustrated in FIG. 7A~FIG. 7D, when three bands are selected from the general bands, duplexers of which the passbands are close to each other (Band1 and Band2, Band5 and Band8) are located at both ends, and a remaining duplexer with a passband distant from those passbands is located between them. That is to say, a duplexer supporting Band5 or Band8 is located between duplexers supporting Band1 and Band2 (FIG. 7A and FIG. 7C), or a duplexer supporting Band1 or Band2 is located between duplexers supporting Band5 and Band8 (FIG. 7B and FIG. 7D). This enables to suppress signal interference by the duplexers supporting passbands close to each other.

The second embodiment can also achieve the downsizing and the cost reduction in a module including two or more duplexers as with the first embodiment. In FIG. 7A through FIG. 7D, the number of the external duplexer 60 mounted on the surface of the multilayered wiring substrate 30 is one, but two or more external duplexers 60 may be mounted.

Third Embodiment

A third embodiment mounts four embedded duplexers.

FIG. 8A through FIG. 8D are schematic views illustrating an arrangement relationship among the duplexers in accordance with the third embodiment, and correspond to FIG. 3A through FIG. 3D of the first embodiment and FIG. 7A through FIG. 7D of the second embodiment. The external duplexer 60 supporting the regional band is mounted on the surface of the multilayered wiring substrate 30, and the embedded duplexers 40a~40d supporting the general bands are mounted inside the multilayered wiring substrate 30. In the present embodiment, four duplexers supporting all the general bands (Band1, Band2, Band5, and Band8) are arranged.

Here, as illustrated in FIG. 8A~FIG. 8D, when four bands are used as the general bands, the duplexers are preferably arranged so that duplexers of which the passbands are close to each other (Band1 and Band2, Band5 and Band8) are not located next to each other. More specifically, one of duplexers supporting Band5 and Band8 is preferably located between duplexers supporting Band1 and Band2 while one of duplexers supporting Band1 and Band2 is located between the duplexers supporting Band5 and Band8. This enables to suppress signal interference by the duplexers of which the passbands are close to each other.

The third embodiment can also achieve the downsizing and the cost reduction in a module including two or more duplexers as with the first embodiment. In FIG. 8A through FIG. 8D, the number of the external duplexer 60 mounted on the surface of the multilayered wiring substrate 30 is one, but two or more external duplexers 60 may be mounted.

An acoustic wave device may be used as the duplexers described in the first through third embodiments. Examples of the acoustic wave device include a resonator using a surface acoustic wave (SAW), a film bulk acoustic resonator (FBAR) using a bulk acoustic wave, but an acoustic wave device using a Love wave, a boundary wave, or a Lamb wave may be used.

Although the embodiments of the present invention have been described in detail, it is to be understood that the various change, substitutions, and alterations could be made hereto without departing from the spirit and scope of the invention.

What is claimed is:

1. A module substrate comprising:
a multilayered wiring substrate that includes wiring layers; and
embedded duplexers that are embedded in the multilayered wiring substrate and electrically connected to the wiring layers, wherein
the embedded duplexers include duplexers supporting at least two bands of Band1, Band2, Band5, and Band8, wherein:
a wiring layer formed on a surface of the multilayered wiring substrate out of the wiring layers includes a terminal portion that allows an external duplexer supporting at least one of Band3, Band4, Band11, Band13, Band17, and Band20 to be mounted thereon;
Band1 includes a transmit band of 1920~1980 MHz and a receive band of 2110~2170 MHz;
Band2 includes a transmit band of 1850~1910 MHz and a receive band of 1930~1990 MHz;
Band5 includes a transmit band of 824~849 MHz and a receive band of 869~894 MHz;
Band8 includes a transmit band of 880~915 MHz and a receive band of 925~960 MHz;
Band3 includes a transmit band of 1710~1785 MHz and a receive band of 1805~1880 MHz;
Band4 includes a transmit band of 1710~1755 MHz and a receive band of 2110~2155 MHz;
Band11 includes a transmit band of 2500~2570 MHz and a receive band of 2620~2690 MHz;
Band13 includes a transmit band of 777~787 MHz and a receive band of 746~756 MHz;
Band17 includes a transmit band of 704~716 MHz and a receive band of 734~746 MHz; and
Band20 includes a transmit band of 832~862 MHz and a receive band of 791~821 MHz.

2. The module substrate according to claim 1, wherein the embedded duplexers include duplexers supporting Band1 and Band5, Band1 and Band8, Band2 and Band5, or Band2 and Band8.

3. The module substrate according to claim 1, wherein the embedded duplexers include duplexers supporting three bands of Band1, Band2, Band5, and Band8.

4. The module substrate according to claim 3, wherein the duplexers supporting the three bands are arranged so that a first duplexer is located between two second duplexers supporting two bands of which frequency bands are closest to each other among the three bands, a remaining band being supported by the first duplexer.

5. The module substrate according to claim 3, wherein the embedded duplexers include duplexers supporting Band1 and Band2 and Band5, Band1 and Band2 and Band8, Band1 and Band5 and Band8, or Band2 and Band5 and Band8.

6. The module substrate according to claim 1, wherein the embedded duplexers include duplexers supporting four bands of Band1, Band2, Band5, and Band8.

7. The module substrate according to claim 6, wherein the duplexers supporting the four bands are arranged so that one of duplexers supporting Band5 and Band8 is located between duplexers supporting Band1 and Band2 while one of the duplexers supporting Band1 and Band2 is located between the duplexers supporting Band5 and Band8.

8. A module comprising:
the module substrate according to claim 1.

* * * * *